(12) United States Patent
Lee et al.

(10) Patent No.: US 10,892,195 B2
(45) Date of Patent: Jan. 12, 2021

(54) METHOD AND STRUCTURE FOR FORMING A VERTICAL FIELD-EFFECT TRANSISTOR USING A REPLACEMENT METAL GATE PROCESS

(71) Applicant: International Business Machines Corporation, Armonk, NY (US)

(72) Inventors: ChoongHyun Lee, Rensselaer, NY (US); Kangguo Cheng, Schenectady, NY (US); Kisik Choi, Watervliet, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/684,126

(22) Filed: Nov. 14, 2019

(65) Prior Publication Data

US 2020/0083121 A1   Mar. 12, 2020

Related U.S. Application Data

(62) Division of application No. 16/007,546, filed on Jun. 13, 2018, now Pat. No. 10,629,499.

(51) Int. Cl.
*H01L 27/092* (2006.01)
*H01L 21/8238* (2006.01)

(52) U.S. Cl.
CPC .......... *H01L 21/823885* (2013.01); *H01L 21/823814* (2013.01); *H01L 21/823842* (2013.01); *H01L 21/823878* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 6,773,994 | B2 | 8/2004 | Chittipeddi et al. |
| 7,504,700 | B2 | 3/2009 | Zhu et al. |
| 7,719,043 | B2 | 5/2010 | Yamagami et al. |
| 9,455,325 | B2 | 9/2016 | Wann et al. |
| 9,525,064 | B1 | 12/2016 | Balakrishnan et al. |
| 9,530,863 | B1 | 12/2016 | Zhang et al. |
| 9,530,866 | B1 | 12/2016 | Zhang et al. |
| 9,640,636 | B1 | 5/2017 | Bentley et al. |

(Continued)

OTHER PUBLICATIONS

List of IBM Patents or Patent Applications Treated as Related.

*Primary Examiner* — Ali Naraghi
(74) *Attorney, Agent, or Firm* — Daniel Morris; Ryan, Mason & Lewis, LLP

(57) ABSTRACT

A method for manufacturing a vertical transistor device includes forming a first plurality of fins in a first device region on a substrate, and forming a second plurality of fins in a second device region on the substrate. In the method, a plurality of dummy gate layers are formed on the substrate and around portions of each of the first and second plurality of fins in the first and second device regions. A barrier layer is formed between the first and second device regions. More specifically, the barrier layer is formed between respective gate regions of the first and second device regions. The method also includes removing the plurality of dummy gate layers from the first and second device regions, and replacing the removed plurality of dummy gate layers with a plurality of gate metal layers in the first and second device regions.

20 Claims, 18 Drawing Sheets

(56) References Cited

U.S. PATENT DOCUMENTS

| | | | |
|---|---|---|---|
| 9,773,708 B1* | 9/2017 | Zhang | H01L 21/823828 |
| 9,780,208 B1 | 10/2017 | Xie et al. | |
| 9,799,751 B1 | 10/2017 | Zhang et al. | |
| 9,882,047 B2 | 1/2018 | Leobandung | |
| 10,141,306 B2 | 11/2018 | Liu et al. | |
| 2007/0200180 A1 | 8/2007 | Irani et al. | |
| 2011/0108922 A1* | 5/2011 | Liu | H01L 27/092 |
| | | | 257/369 |
| 2011/0127613 A1* | 6/2011 | Beyer | H01L 21/28114 |
| | | | 257/369 |
| 2015/0048445 A1* | 2/2015 | Noebauer | H01L 29/66333 |
| | | | 257/331 |
| 2017/0288030 A1 | 10/2017 | Cheng et al. | |
| 2017/0323977 A1 | 11/2017 | Cheng et al. | |
| 2019/0267319 A1 | 8/2019 | Sharma et al. | |
| 2019/0333993 A1* | 10/2019 | Shu | H01L 21/02458 |

* cited by examiner

METHOD AND STRUCTURE FOR FORMING A VERTICAL FIELD-EFFECT TRANSISTOR USING A REPLACEMENT METAL GATE PROCESS

TECHNICAL FIELD

The field generally relates to semiconductor devices and methods of manufacturing same and, in particular, to forming a vertical field effect transistor (VFET) with a barrier between n-type and p-type transistor regions.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field effect transistors (VFETs) are becoming viable device options for semiconductor devices beyond 7 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

Conventional VFET process flows result in strict constraints on thermal budget for downstream processing steps, such as top source/drain epitaxial growth and dopant activation annealing because a High-k Metal Gate (HKMG) module is formed before the downstream processing steps. High-temperature processes (e.g., >550° C.) for top source/drain formation cause threshold voltage ($V_t$) shift, inversion capacitance-based oxide-equivalent gate dielectric thickness ($T_{inv}$) increase, and $T_{oxgl}$ degradation (where $T_{oxgl}$ is a leakage current metric based on silicon oxide thickness) due to oxygen and metal diffusion into the channel. In addition, channel length ($L_{gate}$) is highly dependent on a metal gate recess processing, which causes large chip to chip variation in $L_{gate}$.

Accordingly, there is a need for a VFET structure and method of forming same that permits processing with less constraints on thermal budget.

SUMMARY

According to an exemplary embodiment of the present invention, a method for manufacturing a vertical transistor device includes forming a first plurality of fins in a first device region on a substrate, and forming a second plurality of fins in a second device region on the substrate. In the method, a plurality of dummy gate layers are formed on the substrate and around portions of each of the first and second plurality of fins in the first and second device regions. A barrier layer is formed between the first and second device regions. More specifically, the barrier layer is formed between respective gate regions of the first and second device regions. The method also includes removing the plurality of dummy gate layers from the first and second device regions, and replacing the removed plurality of dummy gate layers with a plurality of gate metal layers in the first and second device regions.

According to an exemplary embodiment of the present invention, a vertical transistor device includes a first plurality of fins in a first device region on a substrate, and a second plurality of fins in a second device region on the substrate. A first type gate metal layer is disposed in the first device region and a second type gate metal layer is disposed in the second device region, and a barrier layer is disposed between the first and second device regions. More specifically, the barrier layer is disposed between the first type gate metal layer in the first device region and the second type gate metal layer in the second device region. The first and second device regions are n-type and p-type transistor regions, respectively.

According to an exemplary embodiment of the present invention, a method for manufacturing a vertical transistor device includes forming a first plurality of fins in a first device region on a substrate, and forming a second plurality of fins in a second device region on the substrate. In the method, a plurality of dummy gate layers are formed on the substrate and around portions of each of the first and second plurality of fins in the first and second device regions. A barrier layer is formed between the first and second device regions. The method further includes removing the plurality of dummy gate layers from the first and second device regions, and replacing the removed plurality of dummy gate layers with a first type gate metal layer in the first device region and a second type gate metal layer in the second device region. The barrier layer is formed between the first type gate metal layer in the first device region and the second type gate metal layer in the second device region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
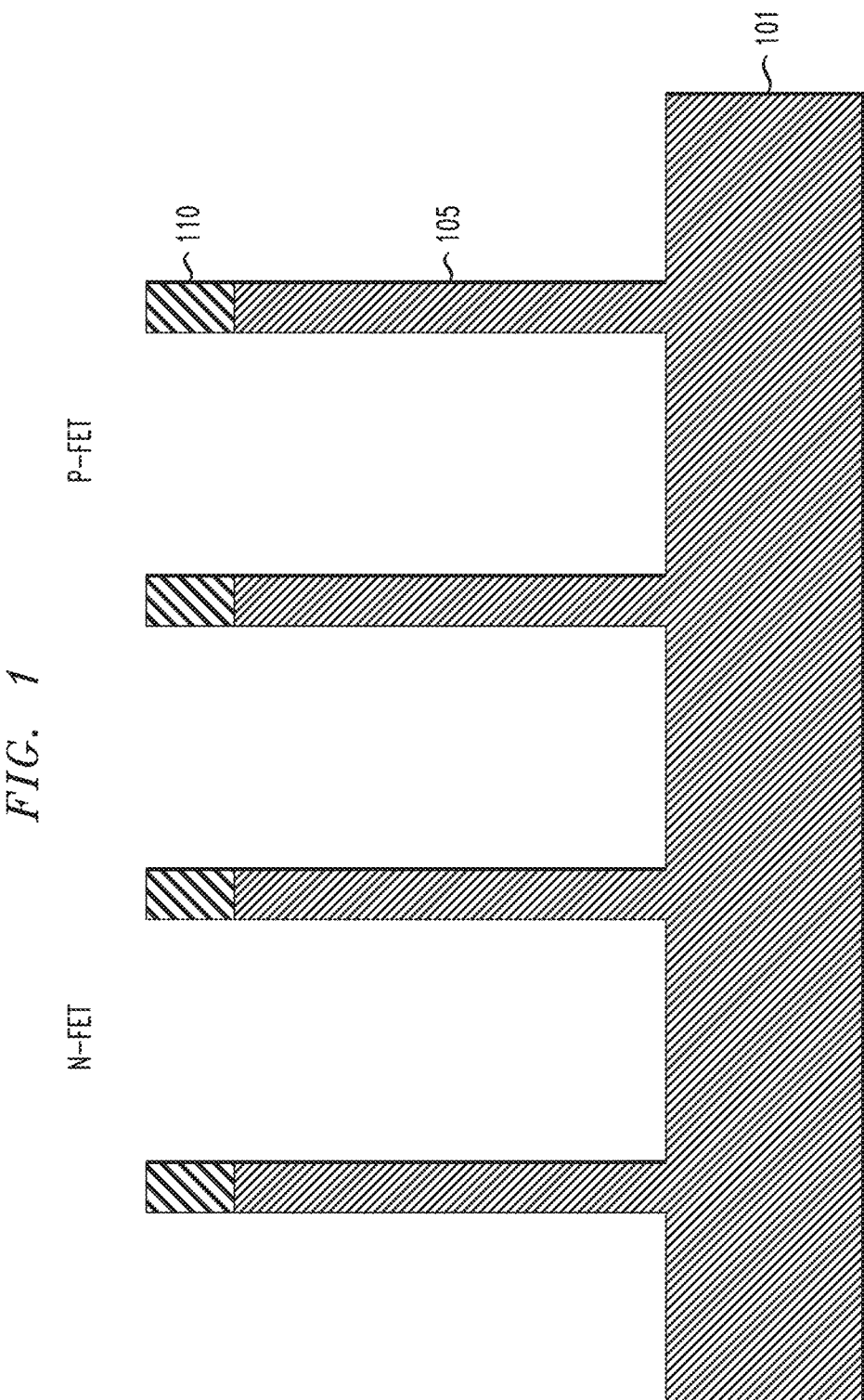
FIG. 1 is a cross-sectional view illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to VFET devices including a barrier between n-type and p-type transistor regions that prevents undercutting during replacement metal gate processing and allows for common gate and source/drain contacts.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for VFETs with a replacement metal gate (RMG) process, which removes the limitations on thermal budgets for gate stacks. The RMG process, in accordance with embodiments of the present invention, utilizes dummy gate removal and a barrier between metal gate regions of n- and p-type transistors ("n/p barrier") to provide accurate channel length ($L_{gate}$) definition. In addition, the n/p barrier prevents undercutting of a gate metal region during dummy gate and/or gate metal removal from a gate structure of an adjacent transistor. Embodiments of the present invention also provide for self-aligned gate cap formation to avoid gate to top source/drain region shorts. Due to the presence of the n/p barrier, a common gate contact, a common bottom source/drain contact and a common top source/drain contact can be utilized for n-type and p-type transistors (e.g., N-FETs and P-FETs).

FIG. 1 is a cross-sectional view illustrating fin formation in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 105, can be formed by patterning a semiconductor layer into the fins 105. The semiconductor layer can include, but is not necessarily limited to, Si, SiGe or III-V materials, and may be epitaxially grown. According to an embodiment, a hardmask 110 including, for example, a dielectric material, such as silicon nitride (SiN) is formed on portions of the semiconductor layer that are to be formed into the fins 105. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. In addition, although four fins 105 are shown in the figures for ease of explanation, more or less than four fins can be formed.

Figure 2:
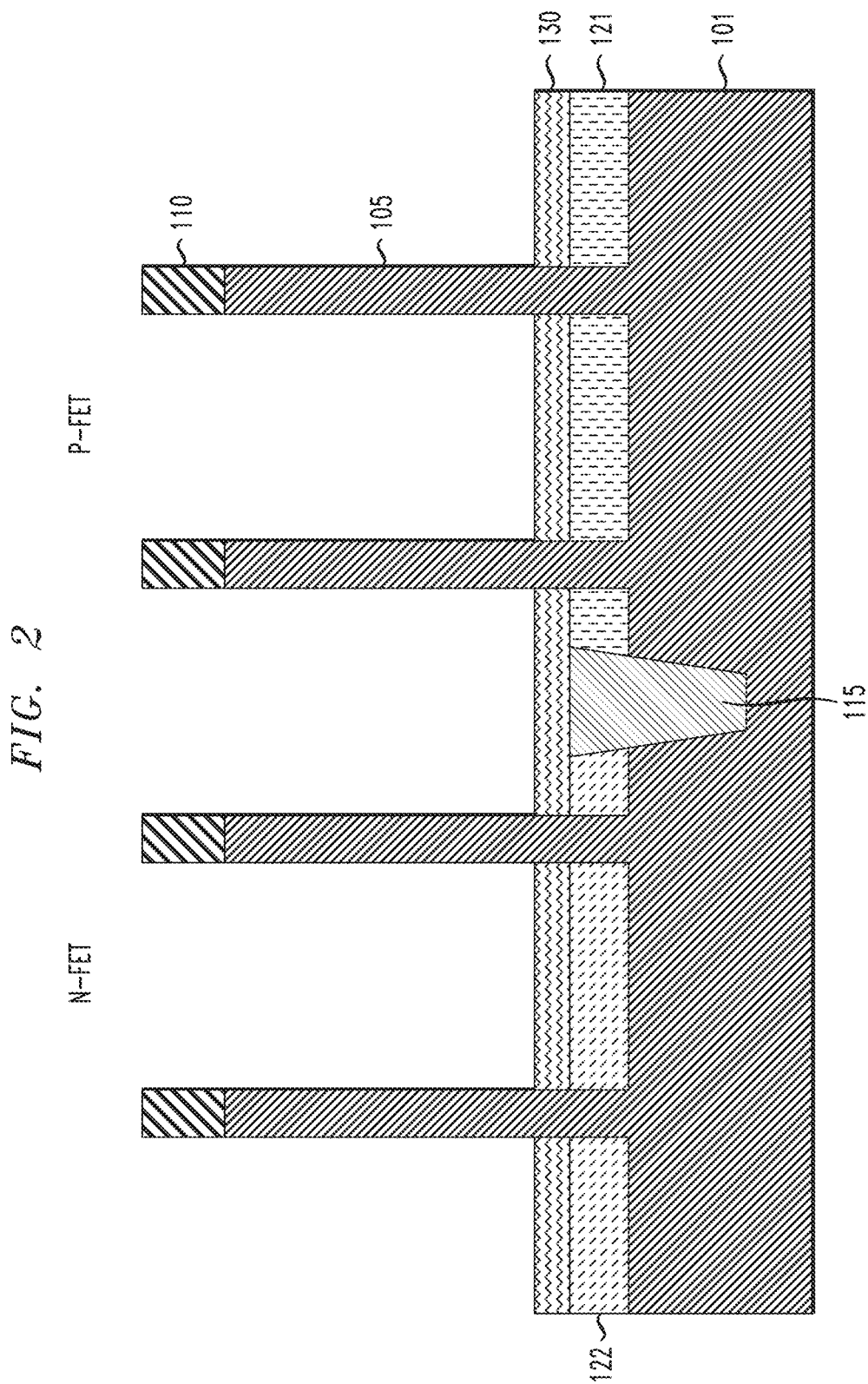
FIG. 2 is a cross-sectional view illustrating bottom source/drain and bottom spacer formation in a method of manufacturing a semiconductor device, according to an exemplary embodiment of the present invention.

FIG. 2 is a cross-sectional view illustrating bottom source/drain and bottom spacer formation in a method of manufacturing a semiconductor device, according to an exemplary embodiment of the present invention. Referring to FIG. 2, one or more trenches are formed in the substrate 101, by for example, a wet or dry etch process. A dielectric material layer including, but not necessarily limited to silicon oxide ($SiO_x$), where x is, for example, 2 in the case of silicon dioxide ($SiO_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed on the substrate 101 and in the trenches, and around the fins 105. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process, such as, chemical mechanical planarization (CMP) to remove excess dielectric material. Portions of the dielectric layer are removed from around the fins 105 in what are the n-type and p-type transistor regions (N-FET and P-FET) regions to define one or more isolation regions 115, such as, for example, shallow trench isolation (STI) regions. The patterning of the dielectric layer can be performed using appropriate masking and removal techniques, including, but not necessarily limited to, ME and optical lithography.

Bottom source/drain regions 121 and 122 are formed in the P-FET and N-FET regions, respectively, around the fins 105. The bottom source/drain regions 121 and 122 can be formed by bottom-up epitaxial growth processes (with optional dummy vertical dielectric liners covering fin sidewalls during epitaxial growth), wherein the bottom source/drain regions 121 and 122 are grown in separate epitaxial processes from each other to certain height (thickness) such as, but not necessarily limited to about 10 nm to about 50 nm. The epitaxially grown bottom source/drain regions 121 and 122 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 121 includes boron doped SiGe, and the bottom source/drain region 122 includes phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring further to FIG. 2, a bottom spacer layer 130 is formed on the bottom source/drain regions 121 and 122 and the isolation region 115. The bottom spacer layer 130 includes, but is not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer layer 130 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE. Spacer material 130 formed on the hardmasks 110 can be removed using a planarization process, such as, for example, CMP.

Figure 3:
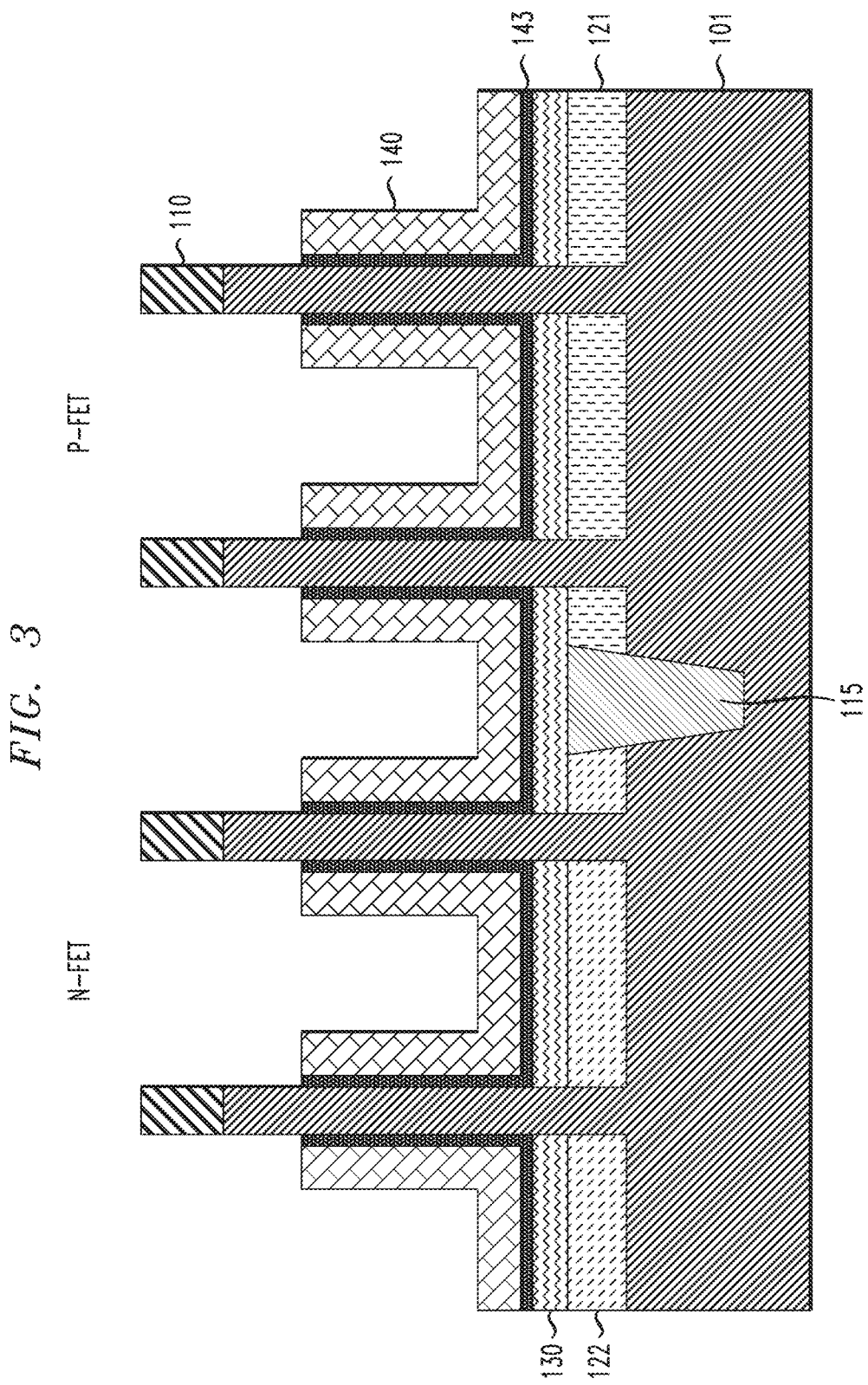
FIG. 3 is a cross-sectional view illustrating a dummy gate stack formation and recessing in a method of manufacturing a semiconductor device, according to an exemplary embodiment of the present invention.

FIG. 3 is a cross-sectional view illustrating a dummy gate stack formation and recessing in a method of manufacturing a semiconductor device, according to an exemplary embodiment of the present invention. Referring to FIG. 3, dummy gate layers 140 are deposited on gate dielectric layers 143. The gate dielectric layers 143 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The dummy gate layers 140 include but are not limited to, for example, titanium nitride (TiN), amorphous silicon (a-Si), or combinations thereof.

The dummy gate and gate dielectric layers 140 and 143 are conformally deposited on the bottom spacer layer 130 and on and around the fins 105 including the hardmasks 110 thereon. The dummy gate and gate dielectric layers 140 and 143 are deposited using, for example, deposition techniques including, but not limited to, CVD, PECVD, RFCVD, PVD, ALD, MLD, MBD, PLD, LSMCD, sputtering, and/or plating.

Portions of the dummy gate and gate dielectric layers 140 and 143 are recessed or removed. In some embodiments, the recess/removal process comprises filling the gaps between dummy gates with a sacrificial filling material (e.g., amorphous carbon), recessing the amorphous carbon to a desired depth to expose a portion of the dummy gate, etching the exposed dummy gate layers 140 and the gate dielectric layers 143, and then removing the sacrificial filling material.

Figure 4:
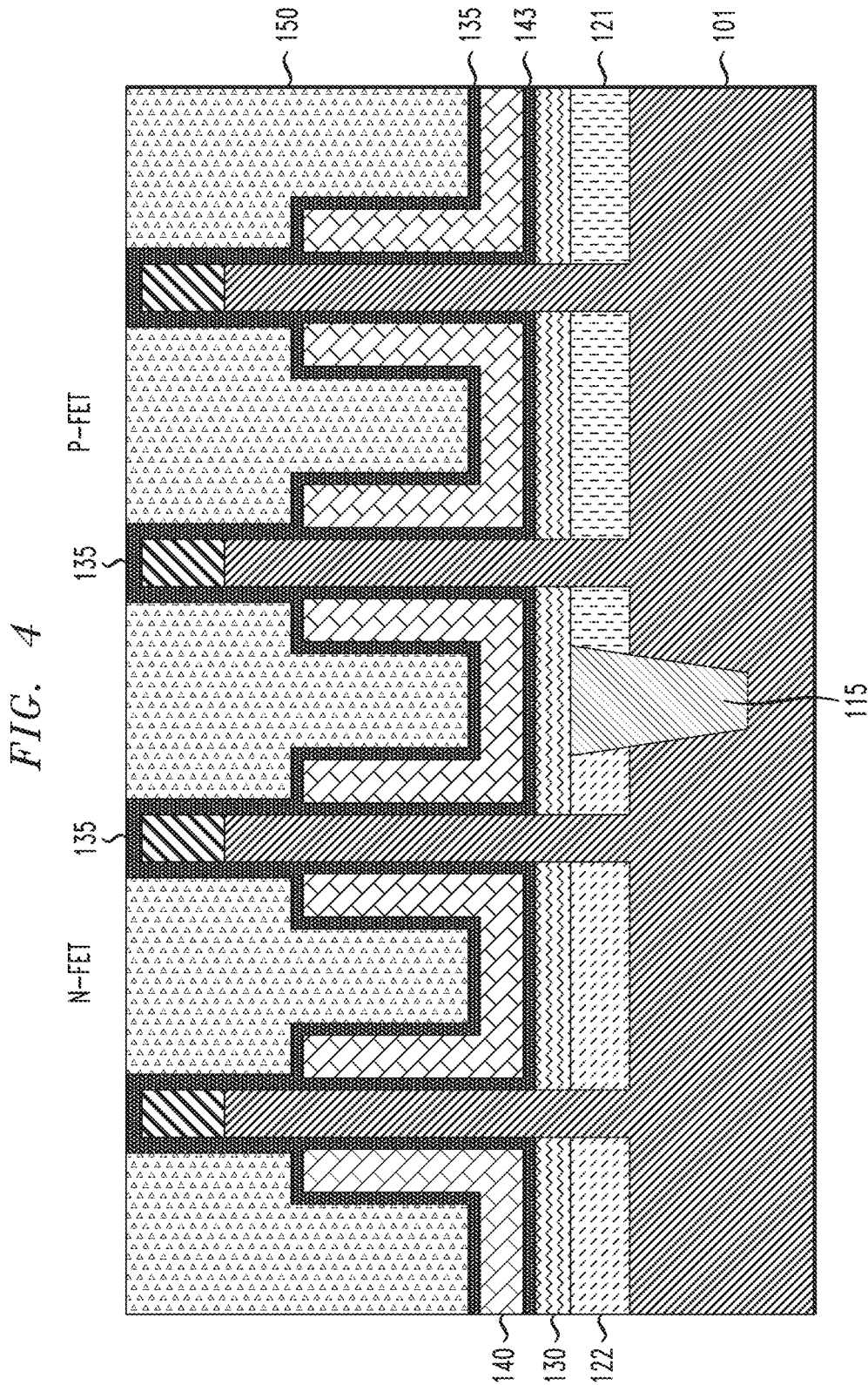
FIG. 4 is a cross-sectional view illustrating top spacer and dielectric fill formation in a method of manufacturing a semiconductor device, according to an exemplary embodiment of the present invention.

FIG. 4 is a cross-sectional view illustrating top spacer and dielectric fill formation in a method of manufacturing a semiconductor device, according to an exemplary embodiment of the present invention. Referring to FIG. 4, a top spacer layer 135 is formed on the dummy gate layer 140, and on an around the fins 105 including the hardmasks 110 thereon. The top spacer layer 135 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the top spacer layer 135 is conformally deposited using, for example, deposition techniques including, but not limited to, CVD, PECVD, RFCVD, PVD, ALD, MLD, MBD, PLD, LSMCD, sputtering, and/or plating.

Following deposition of the top spacer layer 135, a dielectric fill layer 150 is formed on the top spacer layer 135 to fill in gaps between the fins 105 and the dummy gate layers 140. The dielectric fill layer 150 includes, but is not necessarily limited to, silicon oxide, flowable oxide, spin-on-glass, etc. According to an embodiment of the present invention, the dielectric fill layer 150 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. In some embodiments, a thermal anneal process can be performed to densify the dielectric fill layer 150.

Figure 5:
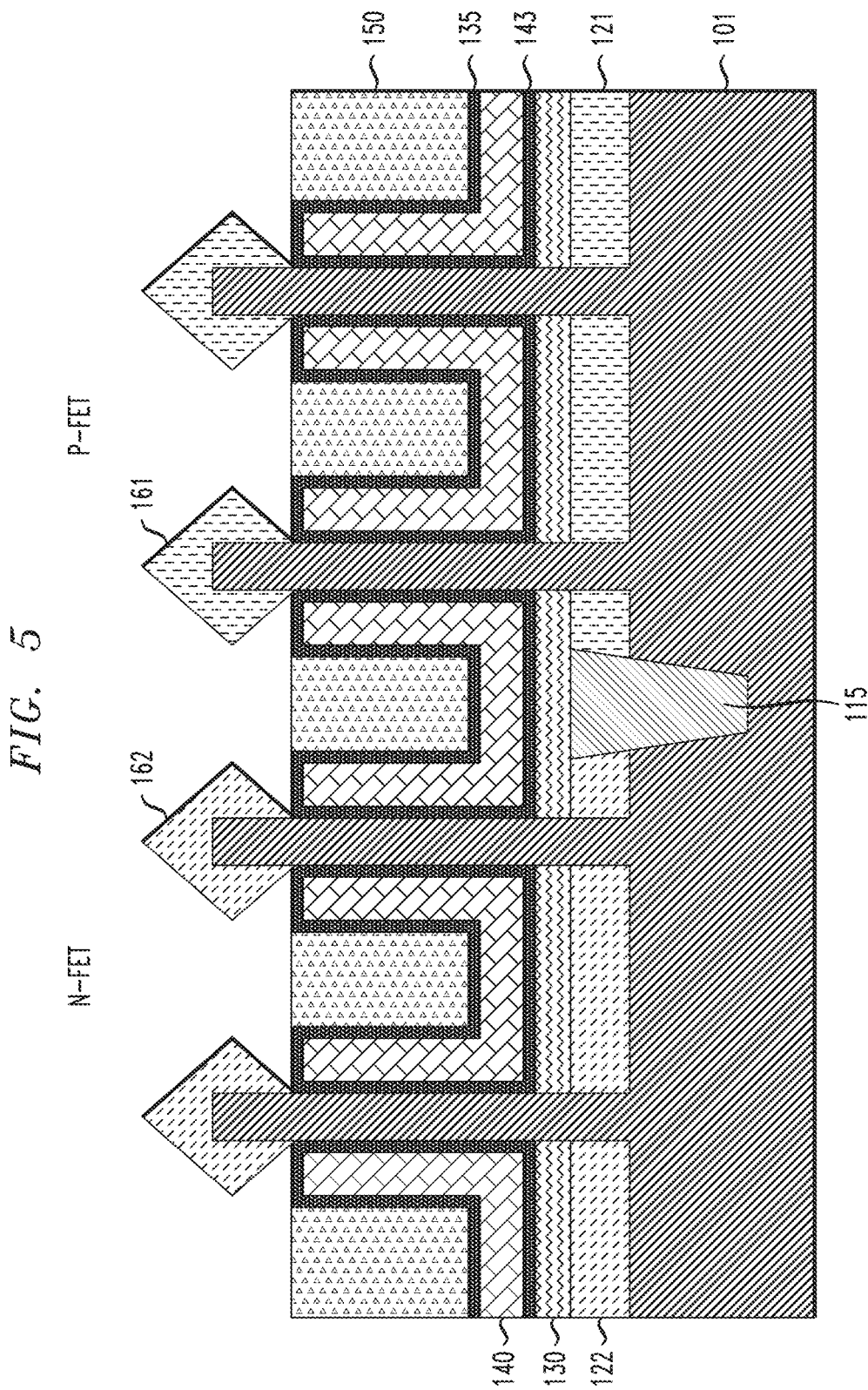
FIG. 5 is a cross-sectional view illustrating top source/drain formation in a method of manufacturing a semiconductor device, according to an exemplary embodiment of the present invention.

FIG. 5 is a cross-sectional view illustrating top source/drain formation in a method of manufacturing a semiconductor device, according to an exemplary embodiment of the present invention. Referring to FIG. 5, the top spacer layer 135 and hardmasks 110 are removed from the upper surfaces of the fins 105, using for example, a planarization process, such as, for example, CMP. Alternatively, the top spacer 135 and hardmask 110 can be removed by selective etch. Then, portions of the top spacer and dielectric fill layers 135 and 150 around upper portions of the fins 105 are removed to expose the upper portions of the fins 105. The removal is performed using, for example, a selective etch process, which is selective to the material of the fins 105. The selective etch process can include, for example, plasma etching containing $CF_4$.

Following the removal of the hardmasks 110 and the removal of remaining upper portions of the top spacer and dielectric fill layers 135 and 150 to expose the upper portions of the fins 105, the top source/drain regions 161 and 162 in the P-FET and N-FET regions, respectively, are epitaxially grown in epitaxial growth processes from the upper portions of the fins 105. The epitaxially grown top source/drain regions 161 and 162 can be formed in different epitaxial growth processes from each other and can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the top source/drain region 161 includes boron doped SiGe, and the top source/drain region 162 includes phosphorous doped silicon.

Figure 6:
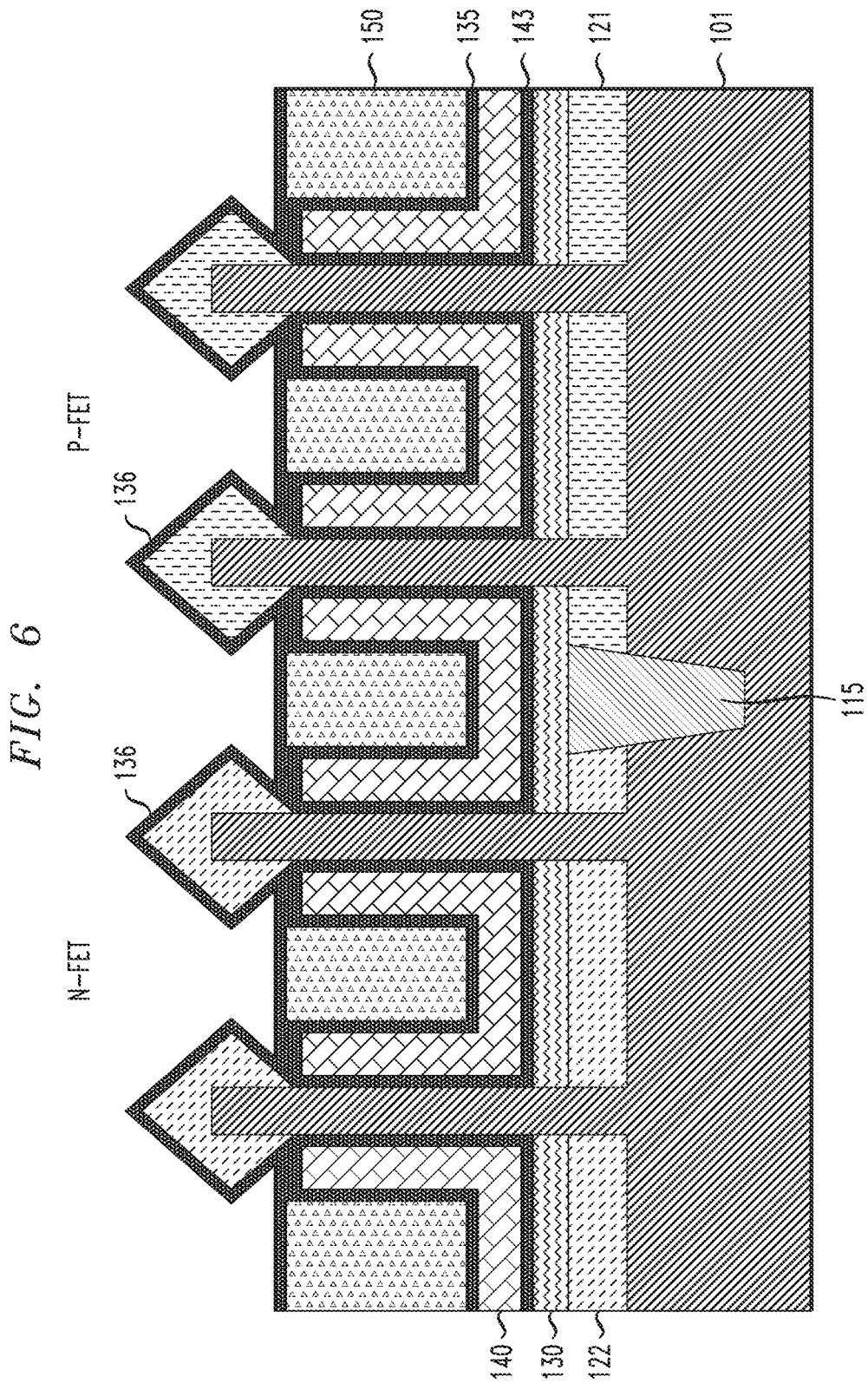
FIG. 6 is a cross-sectional view illustrating deposition of a liner layer in a method of manufacturing a semiconductor device, according to an exemplary embodiment of the present invention.

FIG. 6 is a cross-sectional view illustrating deposition of a liner layer in a method of manufacturing a semiconductor device, according to an exemplary embodiment of the present invention. Referring to FIG. 6, a liner layer 136 is formed on the top source/drain regions 161 and 162, and on exposed upper surfaces of the top spacer and dielectric fill layers 135 and 150. The liner layer 136 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the liner layer 136 is conformally deposited using, for example, deposition techniques including, but not limited to, CVD, PECVD, RFCVD, PVD, ALD, MLD, MBD, PLD, LSMCD, sputtering, and/or plating.

Figure 7:
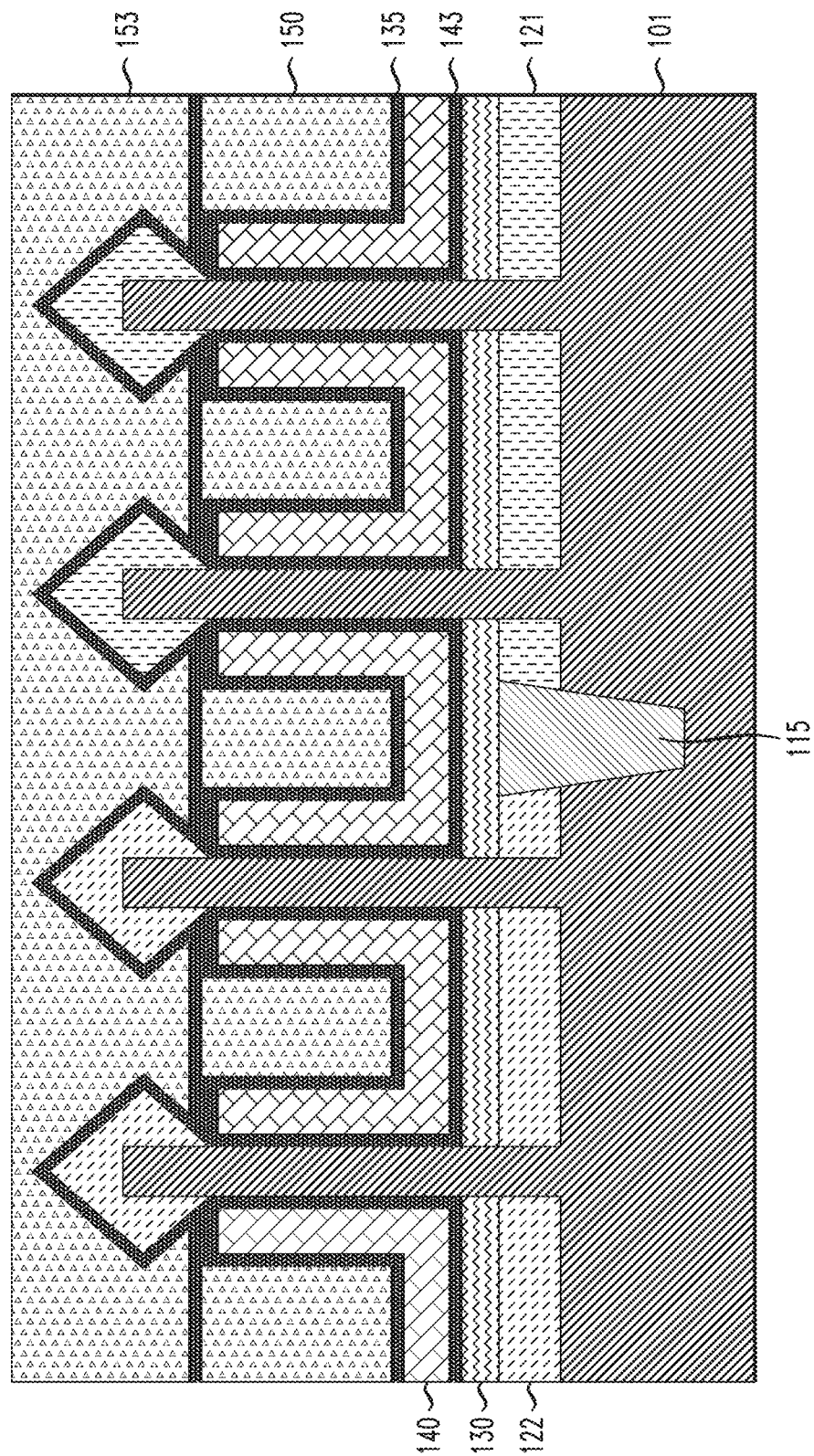
FIG. 7 is a cross-sectional view illustrating deposition of a dielectric fill layer in a method of manufacturing a semiconductor device, according to an exemplary embodiment of the present invention.

FIG. 7 is a cross-sectional view illustrating deposition of a dielectric fill layer in a method of manufacturing a semiconductor device, according to an exemplary embodiment of the present invention. Referring to FIG. 7, following deposition of the liner layer 136, another dielectric fill layer 153 is formed on the liner layer 136 to fill in gaps between the top source/drain regions 161 and 162. The dielectric fill layer 153 includes, but is not necessarily limited to, silicon oxide, flowable oxide, or spin-on-glass. According to an embodiment of the present invention, the dielectric fill layer 153 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. In some embodiments, a thermal anneal process can be performed to densify the dielectric fill layer 153.

Figure 8:
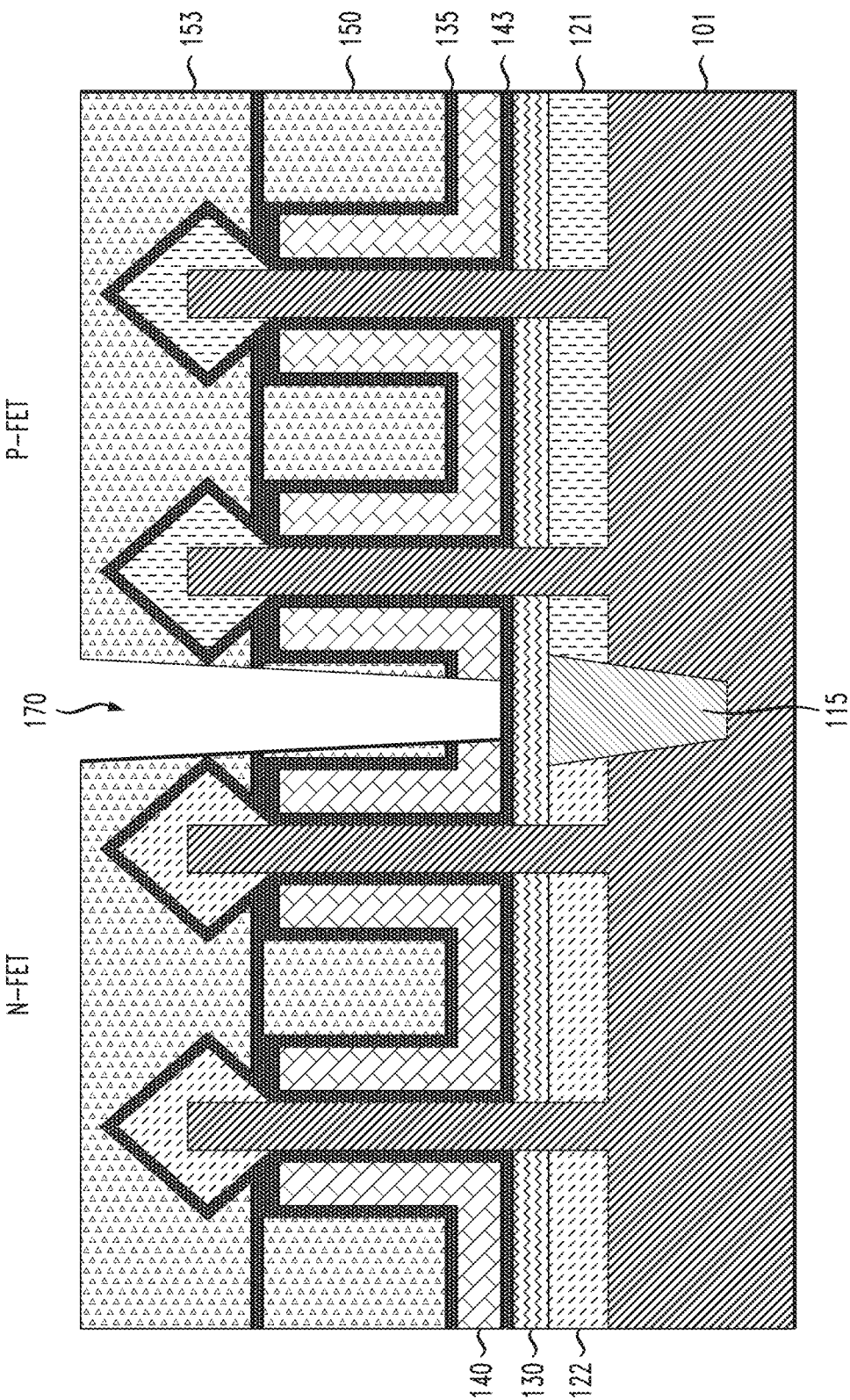
FIG. 8 is a cross-sectional view illustrating formation of an opening between n- and p-type transistor regions in a method of manufacturing a semiconductor device, according to an exemplary embodiment of the present invention.

FIG. 8 is a cross-sectional view illustrating formation of an opening between n- and p-type transistor regions in a method of manufacturing a semiconductor device, according to an exemplary embodiment of the present invention. Referring to FIG. 8, a mask comprising for example, a photoresist, is formed on the upper surface of the dielectric fill layer 153, leaving exposed a portion of the upper surface of the dielectric fill layer 153 between the n- and p-type transistor (N-FET and P-FET) regions. Then, an opening 170 between the N-FET and P-FET regions is formed by removing portions of the dielectric fill layers 150 and 153, liner layer 136, top spacer layer 135 and dummy gate layer 140 between the N-FET and P-FET regions, which are left exposed by the removal process and the mask. The photoresist can be removed by an ashing process.

Figure 9:
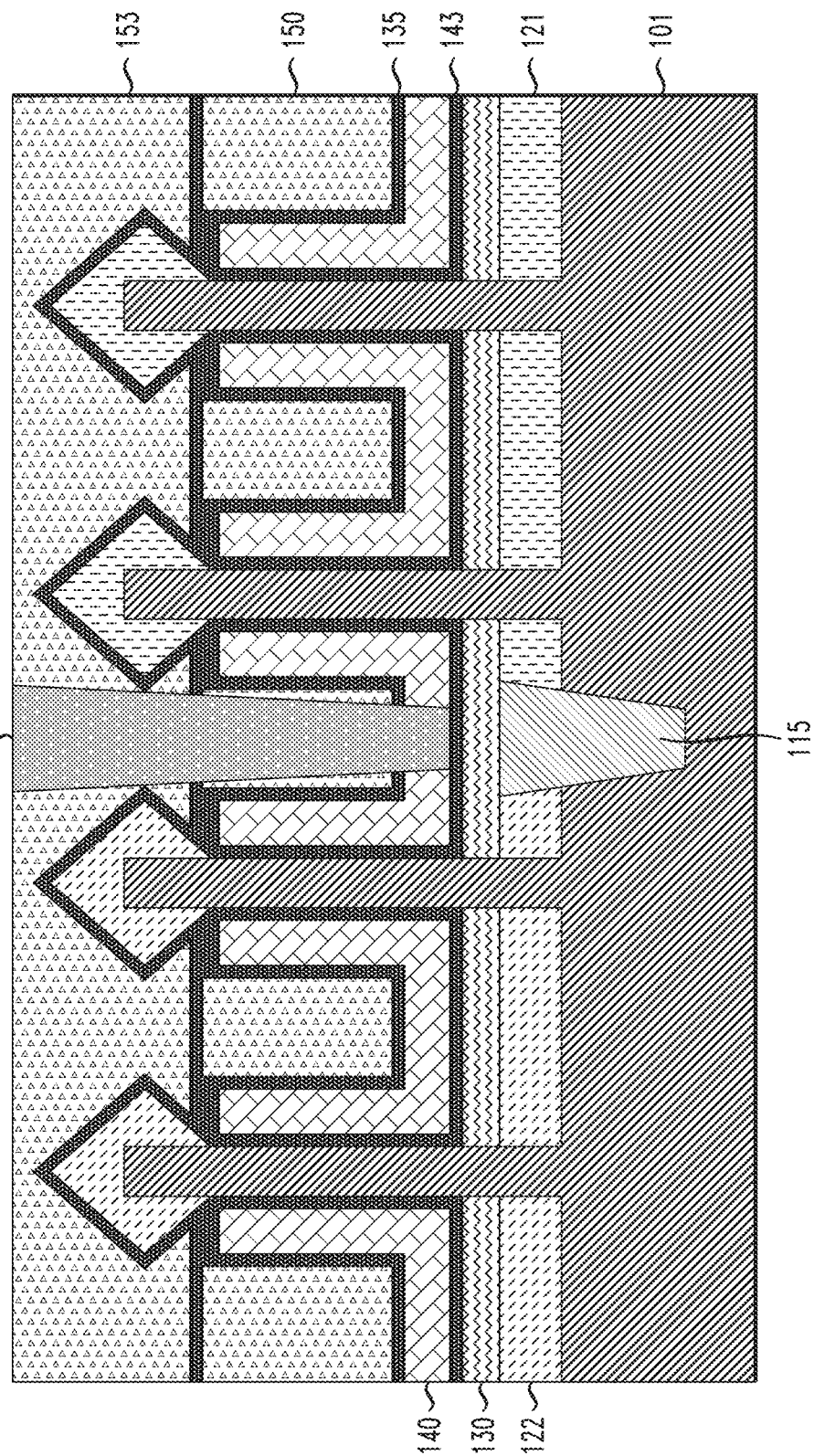
FIG. 9 is a cross-sectional view illustrating deposition of a barrier layer in the opening between n- and p-type transistors in a method of manufacturing a semiconductor device, according to an exemplary embodiment of the present invention.

FIG. 9 is a cross-sectional view illustrating deposition of a barrier layer in the opening between n- and p-type transistors in a method of manufacturing a semiconductor device, according to an exemplary embodiment of the present invention. Referring to FIG. 9, a barrier layer 175 (e.g., n/p barrier) is formed in the opening 170 between the N-FET and P-FET regions. The barrier layer 175 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the barrier layer 175 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. Alternatively, a liner layer comprising, for example, silicon nitride (SiN), silicon boron nitride (SiBN), siliconborocarbonitride (SiBCN), or silicon oxycarbonitride (SiOCN), can be deposited on side and bottom surfaces of the opening 170, followed by deposition of, for example, silicon oxide, to fill a remaining portion of the opening 170. In accordance with an embodiment of the present invention, a material(s) of the barrier layer 175 are resistive to pre-cleaning agents, such as, for example, hydrofluoric acid.

Figure 10:
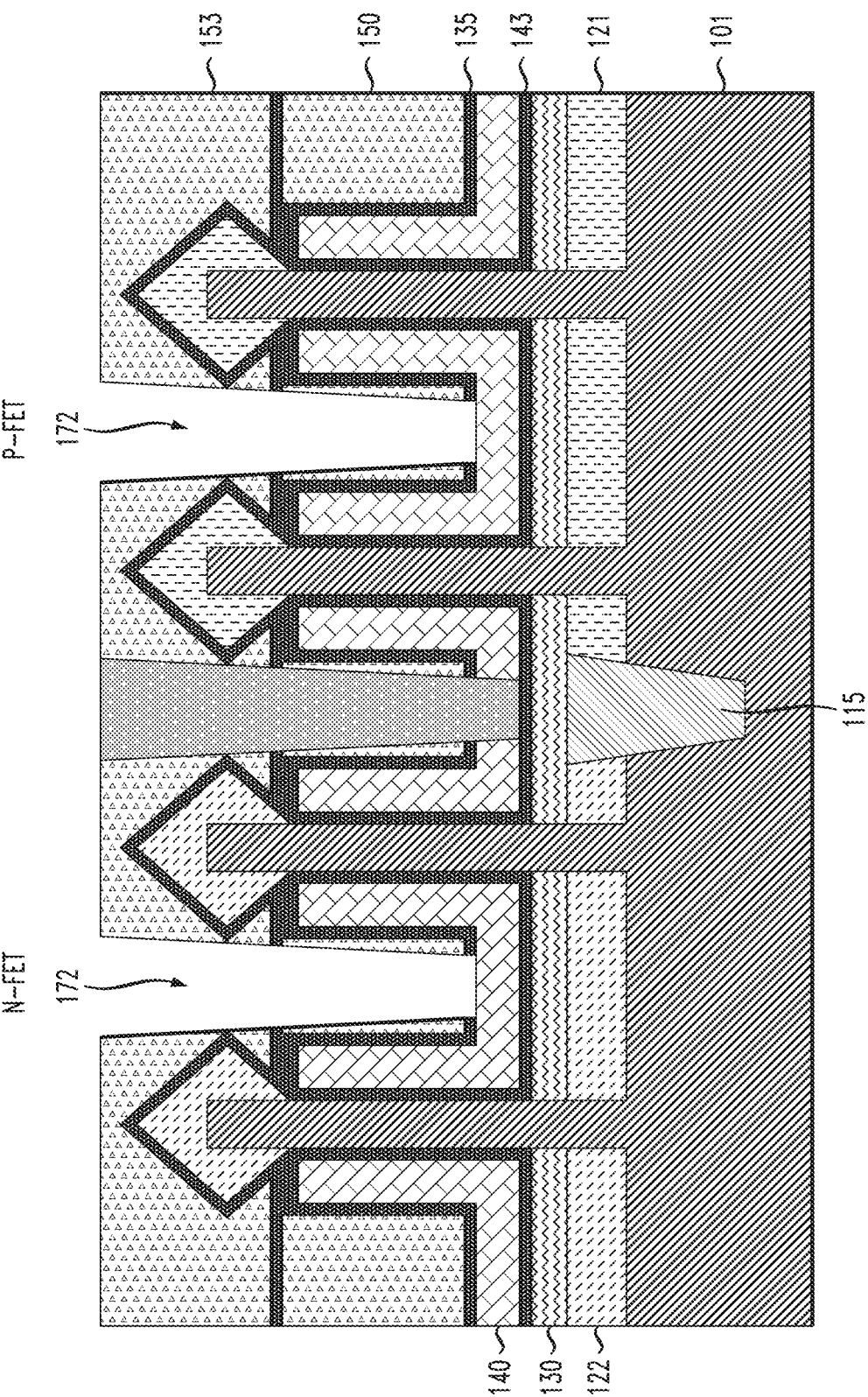
FIG. 10 is a cross-sectional view illustrating formation of a gate contact opening in n- and p-type regions in a method of manufacturing a semiconductor device, according to an exemplary embodiment of the present invention.

FIG. 10 is a cross-sectional view illustrating formation of a gate contact opening in n- and p-type regions in a method of manufacturing a semiconductor device, according to an exemplary embodiment of the present invention. Referring to FIG. 10, a mask comprising for example, a photoresist, is formed on the upper surface of the dielectric fill layer 153, leaving exposed a portion of the upper surface of the dielectric fill layer 153 between fins 105 in the n-type transistor (N-FET) region, and between fins 105 in the p-type transistor (P-FET) region. Then, gate contact openings 172 in the N-FET and P-FET regions are formed by removing portions of the dielectric fill layers 150 and 153, liner layer 136, and top spacer layer 135 to expose the dummy gate layer 140 between in the N-FET and P-FET regions. The photoresist can be removed by an ashing process.

Figure 11:
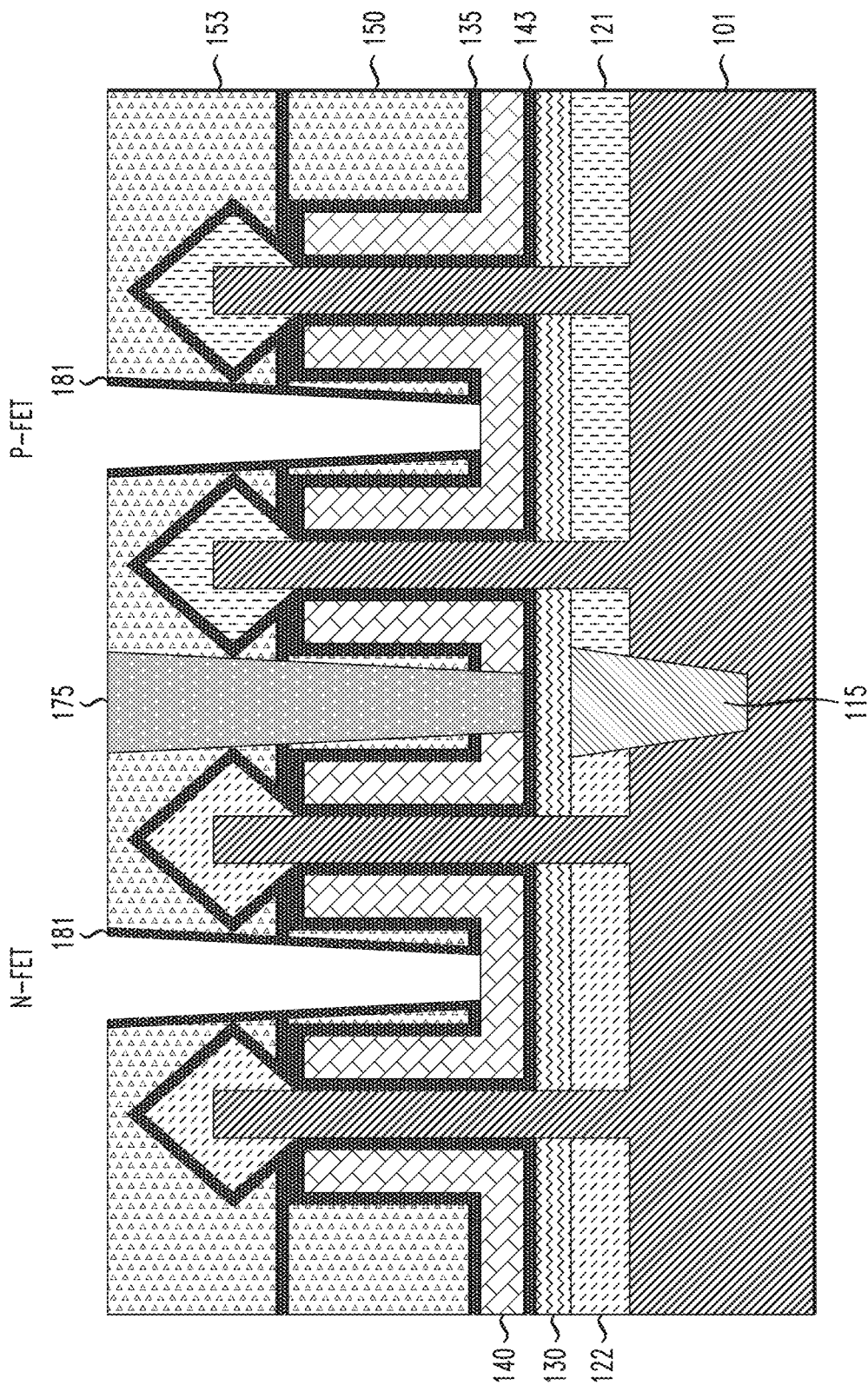
FIG. 11 is a cross-sectional view illustrating gate contact liner formation in a method of manufacturing a semiconductor device, according to an exemplary embodiment of the present invention.

FIG. 11 is a cross-sectional view illustrating gate contact liner formation in a method of manufacturing a semiconductor device, according to an exemplary embodiment of the present invention. Referring to FIG. 11, the gate contact liner 181 is conformally deposited on side and bottom surfaces in the openings 172, and on the upper surface of the dielectric fill layer 153 using, for example, deposition techniques including, but not limited to, CVD, PECVD, RFCVD, PVD, ALD, MLD, MBD, PLD, LSMCD, sputtering, and/or plating. Following conformal deposition, portions of the gate contact liner 181 on horizontal surfaces (e.g., the bottom surfaces of the openings 172 and the upper surface of the dielectric fill layer 153), are removed using directional removal techniques, such as, for example, RIE. According to an embodiment of the present invention, the gate contact liner layer 181 includes, for example, silicon nitride (SiN), silicon boron nitride (SiBN), siliconborocarbonitride (SiBCN), or silicon oxycarbonitride (SiOCN).

Following directional removal, a reliability annealing process can optionally be performed. For example, the reliability annealing process includes a rapid thermal annealing (RTA) at about 800° C.-about 1000° C. Other annealing techniques include, but are not limited to, flash anneal, laser anneal, furnace anneal, etc.

Figure 12:
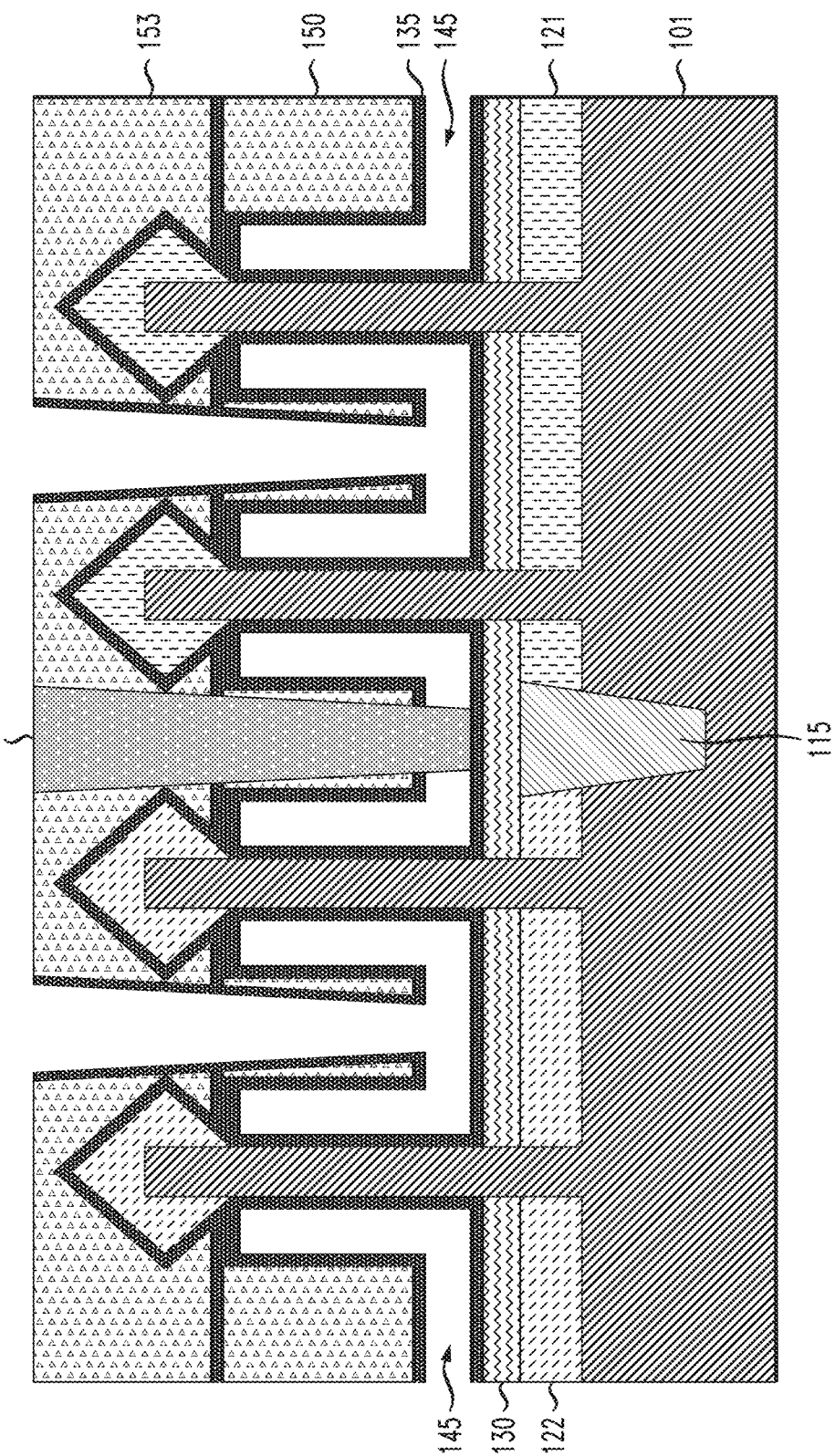
FIG. 12 is a cross-sectional view illustrating dummy gate removal in a method of manufacturing a semiconductor device, according to an exemplary embodiment of the present invention.

FIG. 12 is a cross-sectional view illustrating dummy gate removal in a method of manufacturing a semiconductor device, according to an exemplary embodiment of the present invention. Referring to FIG. 12, the dummy gate layers 140 are selectively removed to create gaps 145 where the dummy gate layers 140 were located. As shown in FIG. 12, the dummy gate layers 140 are selectively removed with respect to the gate dielectric layers 143, gate contact liner layers 181, barrier layer 175, and the top spacer layer 135. The gate contact liner layer 181 and the top spacer layer 135 protect the dielectric fill layers 150 and 153 during the removal and subsequent gate metal deposition processes. In accordance with an embodiment of the present invention, if the dummy gate layers 140 include, for example, a-Si, the removal is performed using, for example, a wet etch containing ammonia, or a dry etch containing $SF_6$, which selectively removes a-Si with respect to a material of the gate dielectric layers 143, and a material of the gate contact liner layers 181, barrier layer 175, and the top spacer layer 135, such as, for example, SiN. If the dummy gate layers 140 include, for example, TiN, the removal is performed using, for example, a wet etch containing hydroperoxide and ammonia, which selectively removes TiN with respect to a material of the gate dielectric layers 143, and a material of the gate contact liner layers 181, barrier layer 175, and the top spacer layer 135, such as, for example, SiN.

Figure 13:
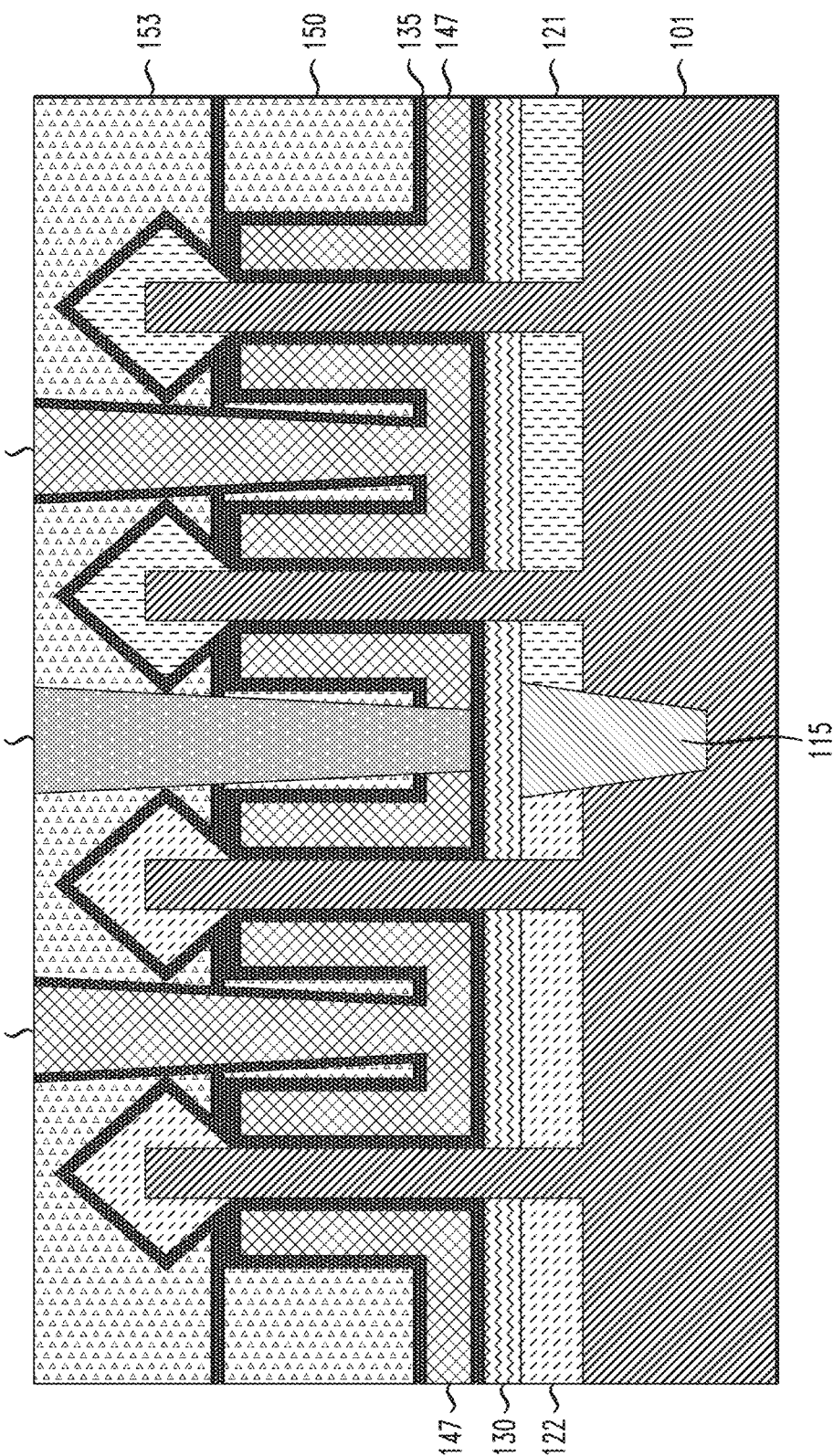
FIG. 13 is a cross-sectional view illustrating a first type work-function metal deposition in a method of manufacturing a semiconductor device, according to an exemplary embodiment of the present invention.

FIG. 13 is a cross-sectional view illustrating a first type work-function metal deposition in a method of manufacturing a semiconductor device, according to an exemplary embodiment of the present invention. Referring to FIG. 13, n-type gate metal layers 147, for example, n-type work function metal layers, are deposited to fill in the gaps 145 where the dummy gate layers 140 were located in both the NFET and PFET regions. The n-type work function metal layers 147 include, but are not necessarily limited to, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. The work function metal layers 147 are deposited using, for example, deposition techniques including, but not limited to, CVD, PECVD, RFCVD, PVD, ALD, MLD, MBD, PLD, LSMCD, sputtering, and/or plating, followed by planarization, such as, for example, CMP, to remove excess portions of the work function metal layers 147 from an upper surface of the dielectric fill layer 153 and the barrier layer 175.

Figure 14:
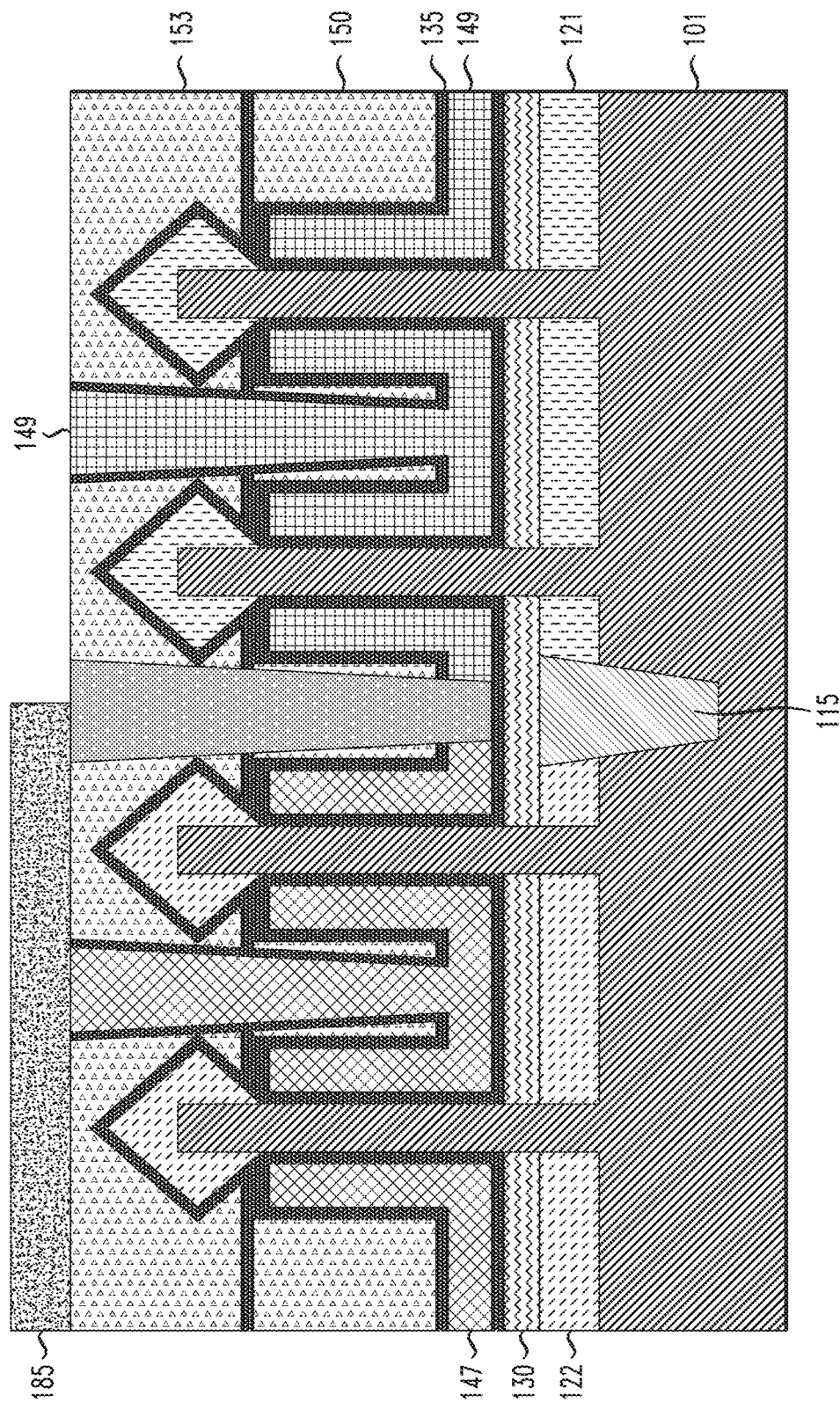
FIG. 14 is a cross-sectional view illustrating removal of a portion of the first type work-function metal and a second type work-function metal deposition in a method of manufacturing a semiconductor device, according to an exemplary embodiment of the present invention.

FIG. 14 is a cross-sectional view illustrating removal of a portion of the first type work-function metal and a second type work-function metal deposition in a method of manufacturing a semiconductor device, according to an exemplary embodiment of the present invention. Referring to FIG. 14, the n-type work-function metal layers 147 are removed from the P-FET region, and p-type gate metal layers 149, for example, p-type work-function metal layers, are deposited in the gaps 145 (see FIG. 12) left by the removal of the n-type work-function metal layers 147 from the P-FET region. As shown in FIG. 14, a mask 185, including, for example, a photoresist, is deposited to cover exposed portions of the dielectric fill layer 153, n-type work function metal layer 147 in the N-FET region, and part of n/p barrier layer 175 adjacent the N-FET region. The mask 185 protects the n-type work function metal layers 147 in the N-FET region while the n-type work function metal layers 147 in the P-FET region are removed. The barrier layer 175 also protects the n-type work function metal layers 147 in the N-FET region from being undercut during the removal process by preventing an etchant from accessing lower portions of the n-type work function metal layers 147 in the N-FET region. The n-type work function metal layers 147 are removed from the P-FET region using, for example, ashing process, which leaves the gaps 145 as discussed in connection with FIG. 12 on the p-type transistor side.

The p-type work function metal layers 149 include, but are not necessarily limited to, titanium nitride (TiN), tantalum nitride (TaN) or ruthenium (Ru). The work function metal layers 149 are deposited using, for example, deposition techniques including, but not limited to, CVD, PECVD, RFCVD, PVD, ALD, MLD, MBD, PLD, LSMCD, sputtering, and/or plating, followed by planarization, such as, for example, CMP, to remove excess portions of the work function metal layers 149 from an upper surface of the dielectric fill layer 153 and the barrier layer 175. Alternatively, in connection with FIGS. 13 and 14, the p-type work function metal layers 149 can be deposited in both N-FET and P-FET regions, and then the mask 185 would be deposited to cover exposed portions of the dielectric fill layer 153, p-type work function metal layer 149 in the P-FET region, and part of n/p barrier layer 175 adjacent the P-FET region so that the p-type work function metal layers 149 can be removed from the N-FET region, and replaced with the n-type work function metal layers 147. In this case, the barrier layer 175 protects the p-type work function metal layers 149 in the P-FET region from being undercut during the removal process by preventing an etchant from accessing lower portions of the p-type work function metal layers 149 in the P-FET region.

In another alternative embodiment, referring back to FIGS. 11 and 12, a mask the same or similar to mask 185 can be deposited on the structure in FIG. 11 to cover the N-FET region or the P-FET region, respectively. Then, instead of removing the dummy gate layers 140 from both N-FET and P-FET regions at the same time, as described in connection with FIG. 12, the dummy gate layers 140 are removed from the region that is not covered by the mask, and the corresponding work function metal layer (n- or p-type) is deposited in the gaps left by the removal of the dummy gate layers 140 in that region. In other words, if the N-FET region is covered by a mask, the dummy gate layers 140 from the P-FET region are removed and replaced by the p-type work function metal layers or vice versa.

In this other alternative embodiment, following removal of dummy gate layers 140 and replacement with work function metal layers from the first type region, the mask the same or similar to mask 185 is deposited to cover the first type region and expose the second type region, where removal of the dummy gate layers 140 and replacement with the corresponding work function metal layer in that region is performed to result in the structure shown in FIG. 14. In this other alternative embodiment, the barrier layer 175 protects the first deposited work function metal layer (either n- or p-type) from being undercut during the removal of the dummy gate layers 140 from the opposite type region by preventing an etchant from accessing lower portions of the first deposited work function metal layer.

Figure 15:
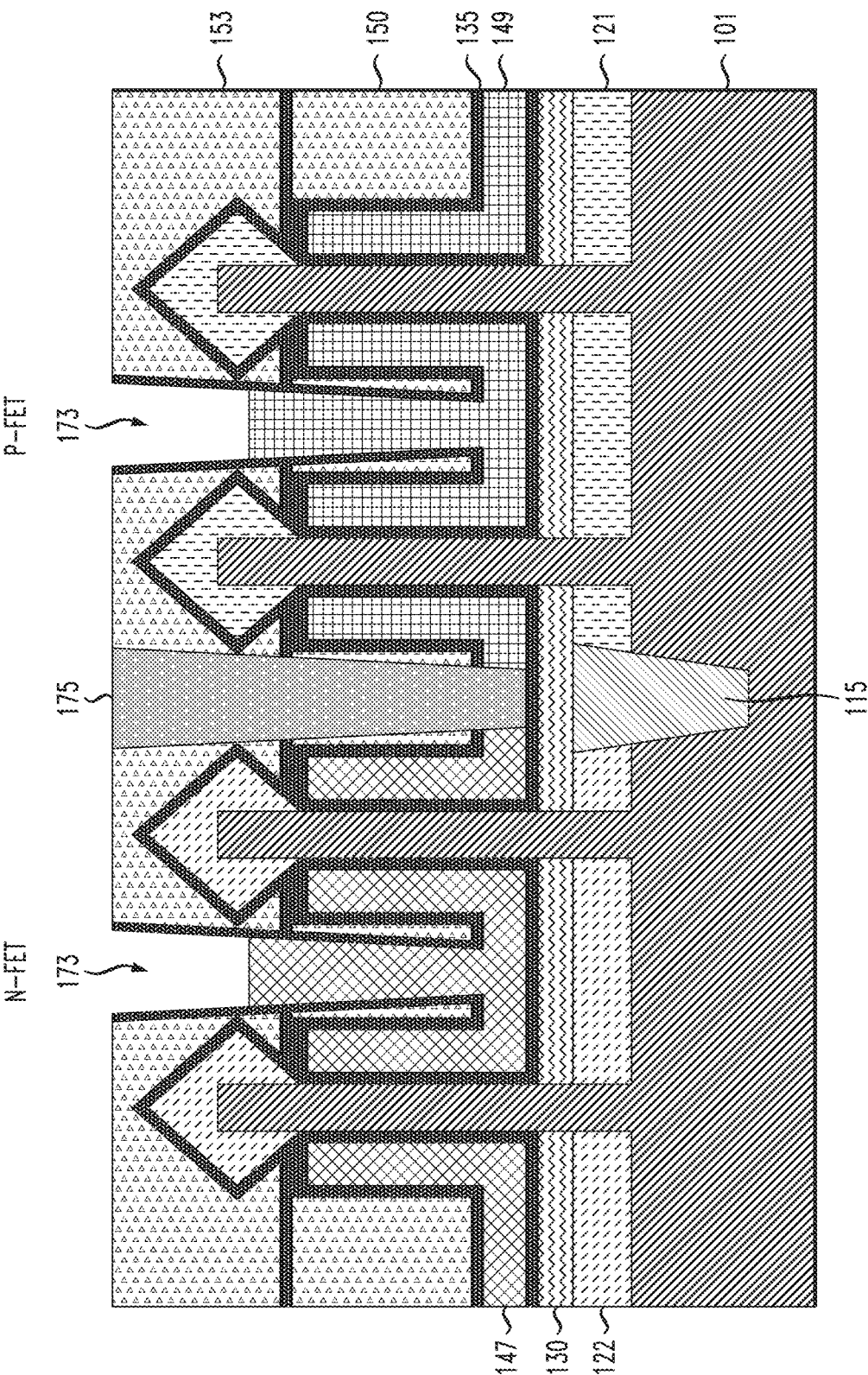
FIG. 15 is a cross-sectional view illustrating gate metal recessing in a method of manufacturing a semiconductor device, according to an exemplary embodiment of the present invention.

FIG. 15 is a cross-sectional view illustrating gate metal recessing in a method of manufacturing a semiconductor device, according to an exemplary embodiment of the present invention. Referring to FIG. 15, the n-type and p-type work function metal layers 147 and 149 are recessed to a lower height to form openings 173. The recess process comprises an etch process (e.g., RIE) that selectively etches the layers 147 and 149 with respect to the liner, barrier and dielectric fill layers 181, 175 and 153.

Figure 16:
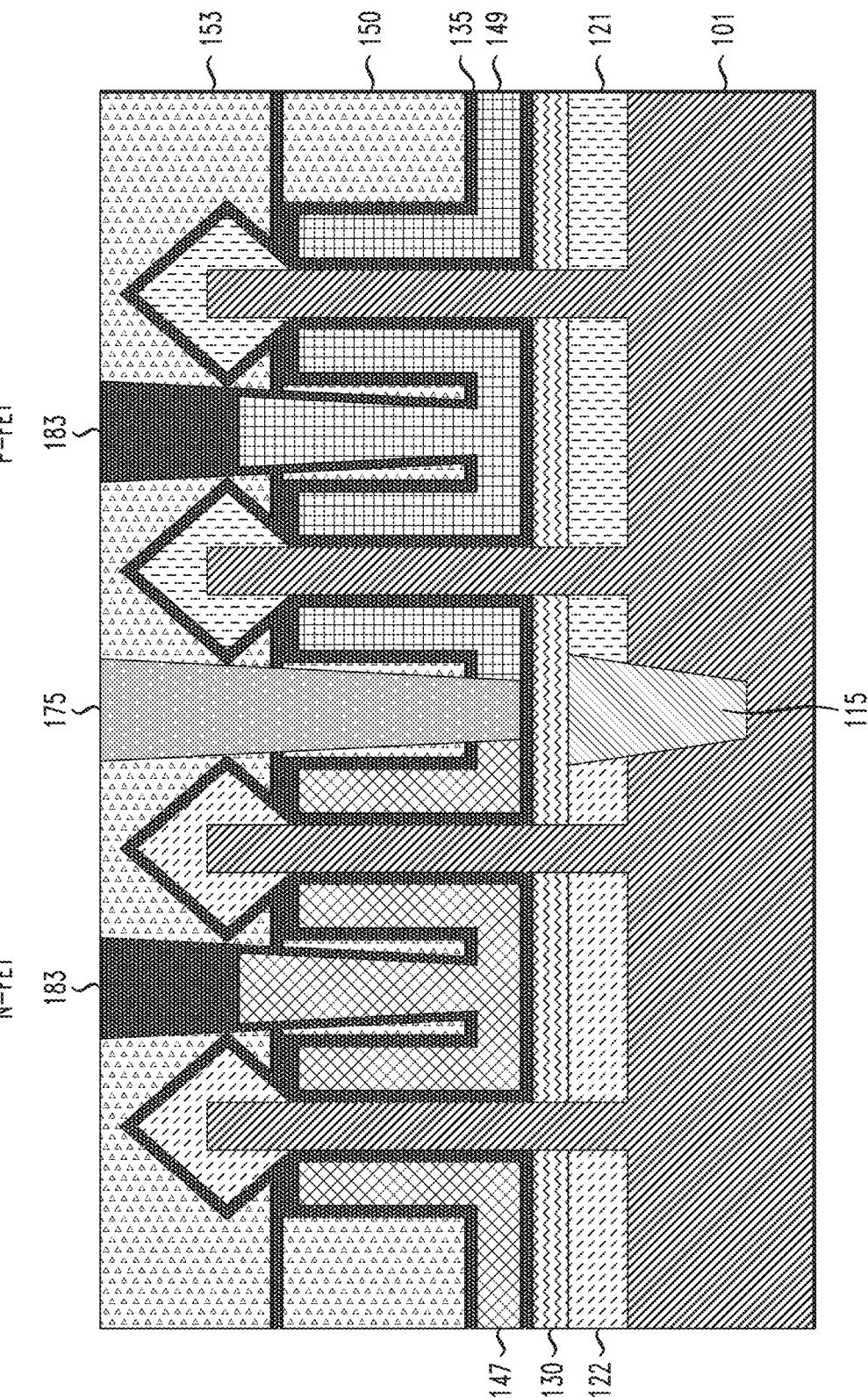
FIG. 16 is a cross-sectional view illustrating self-aligned gate cap layer formation in a method of manufacturing a semiconductor device, according to an exemplary embodiment of the present invention.

FIG. 16 is a cross-sectional view illustrating self-aligned gate cap layer formation in a method of manufacturing a semiconductor device, according to an exemplary embodiment of the present invention. Referring to FIG. 16, self-aligned gate cap layers 183 are formed in the openings 173 on the recessed n-type and p-type work function metal layers 147 and 149 in the N-FET and P-FET regions. The self-aligned gate cap layers 183 include, but are not necessarily limited to, silicon nitride (SiN), silicon boron nitride (SiBN), siliconborocarbonitride (SiBCN), or silicon oxycarbonitride (SiOCN). According to an embodiment of the present invention, the self-aligned gate cap layers 183 are deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. The self-aligned gate cap layers 183 prevent shorts between a top source drain contact(s) and gate regions.

In accordance with an embodiment of the present invention, the self-aligned gate cap, gate contact liner, barrier, liner, and top spacer layers, 183, 181, 175, 136 and 135 are formed of the same material, such as, for example, SiN, SiBN or SiOCN.

Figure 17:
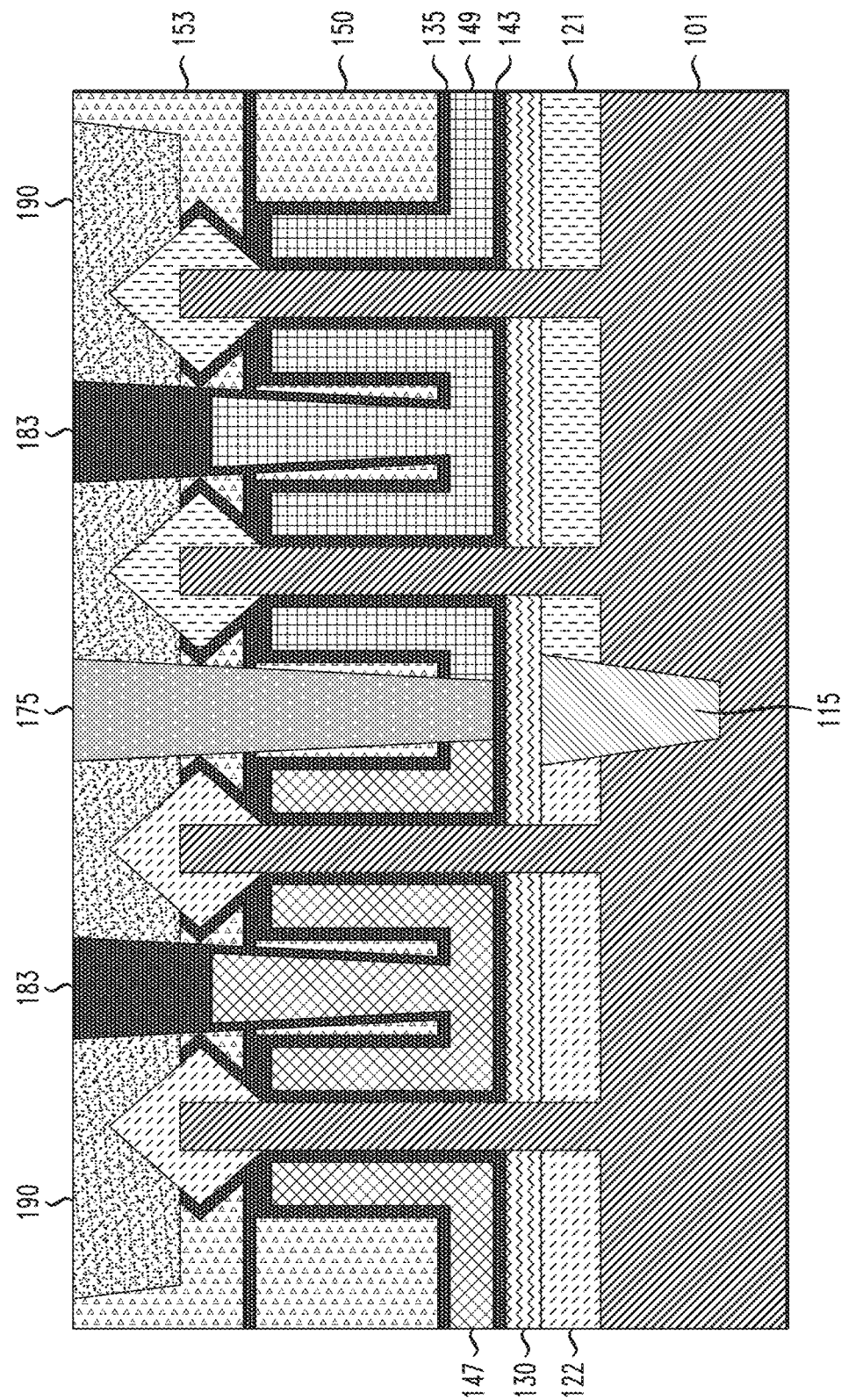
FIG. 17 is a cross-sectional view illustrating formation of a top source/drain contact in a method of manufacturing a semiconductor device, according to an exemplary embodiment of the present invention.

FIG. 17 is a cross-sectional view illustrating formation of a top source/drain contact in a method of manufacturing a semiconductor device, according to an exemplary embodiment of the present invention. Referring to FIG. 17, a trench is opened in the dielectric fill layer 153 over the top source/drain regions 161 and 162 using, for example, lithography followed by RIE. The liner layer 136 on the top source/drain regions 161 and 162 is removed to expose the top source/drain regions 161 and 162. A contact to top source/drain regions 161 and 162 is formed in the trench by filling the trench with a contact material layer 190, such as, for example, electrically conductive material including, but not necessarily limited to, tungsten, cobalt, zirconium, tantalum, titanium, aluminum, ruthenium, and/or copper. A liner layer including, for example, titanium and/or titanium nitride, may be formed on side and bottom surfaces of the trench and on the top source/drain regions 161 and 162 before filling the trench with the contact material layer 190. The structure including a single contact region in one trench to multiple source/drain regions 161, 162, as opposed to multiple contacts in respective trenches to corresponding source/drain regions, increases the area and volume of the contact region, resulting in a lower resistance of the contact region than when a plurality of contacts are used. As can be understood from FIG. 17, the self-aligned gate cap layers 183 prevent shorts between the top source drain contact and gate regions.

Deposition of the contact material layer 190 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Figure 18:
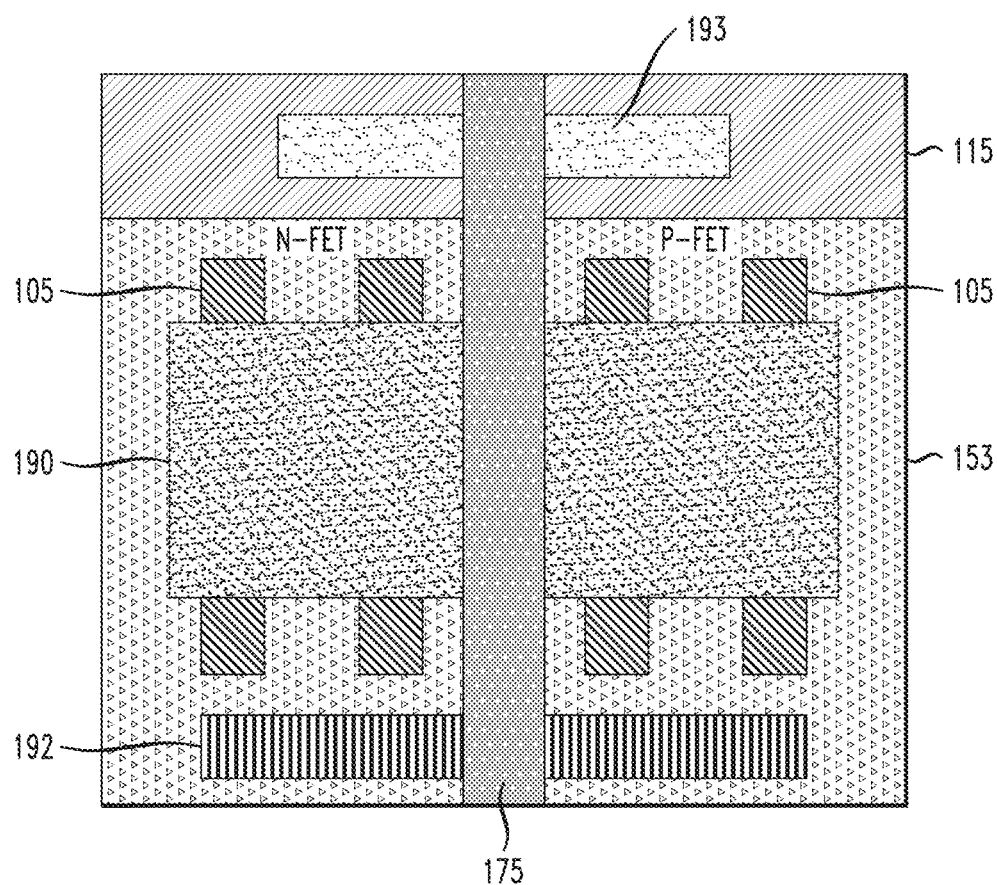
FIG. 18 is a top view of the semiconductor device in FIG. 17, according to an exemplary embodiment of the present invention.

FIG. 18 is a top view of the semiconductor device in FIG. 17, according to an exemplary embodiment of the present invention. As can be seen in FIG. 18, due to the presence of the barrier 175 between N-FET and P-FET regions, a gate contact (CB) 193, a bottom source/drain contact (trench silicide (TS)) 192 and a top source/drain contact (CA) 190, can be shared between n- and p-type transistors. In accordance with an embodiment of the present invention, in case a connection is required between N-FET and P-FET gates, an upper level (V0) can connect the gates.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A vertical transistor device, comprising:
   a first plurality of fins in a first device region on a substrate;
   a second plurality of fins in a second device region on the substrate;
   a first type gate metal layer in the first device region and a second type gate metal layer in the second device region; and
   a barrier layer between the first and second device regions;
   wherein the barrier layer is disposed between the first type gate metal layer in the first device region and the second type gate metal layer in the second device region;
   wherein part of the first type gate metal layer and part the second type gate metal layer contact the barrier layer;
   wherein a bottom surface of the barrier layer is coplanar with a bottom surface of the first type gate metal layer and with a bottom surface of the second type gate metal layer; and
   wherein the first device region is an n-type transistor region and the second device region is a p-type transistor region.

2. The vertical transistor device according to claim 1, further comprising:
   a plurality of top source/drain regions on upper portions of each of the first and second plurality of fins in the first and second device regions; and
   a common top source/drain contact to the plurality of top source/drain regions disposed in the first and second device regions.

3. The vertical transistor device according to claim 1, further comprising a plurality of gate cap layers respectively on each of the first and second type of gate metal layers.

4. The vertical transistor device according to claim 1, further comprising:
   a plurality of bottom source/drain regions on the substrate and around lower portions of each of the first and second plurality of fins in the first and second device regions; and
   a common bottom source/drain contact to the plurality of bottom source/drain regions disposed in the first and second device regions.

5. The vertical transistor device according to claim 4, further comprising liner layers formed on lower portions of the plurality of bottom source/drain regions under the common bottom source/drain contact.

6. The vertical transistor device according to claim 1, further comprising:

a first type bottom source/drain region on the substrate and around lower portions of the first plurality of fins in the first device region; and a second type bottom source/drain region on the substrate and around lower portions of the second plurality of fins in the second device region.

7. The vertical transistor device according to claim 6, further comprising a common bottom source/drain contact to the first and second type bottom source/drain regions.

8. The vertical transistor device according to claim 7, further comprising liner layers formed on lower portions of the first and second type bottom source/drain regions under the common bottom source/drain contact.

9. The vertical transistor device according to claim 1, further comprising a common gate contact to the first and second type of gate metal layers disposed in the first and second device regions.

10. The vertical transistor device according to claim 1, wherein:
    the first type gate metal layer comprises an n-type work function metal layer; and
    the second type gate metal layer comprises a p-type work function metal layer.

11. The vertical transistor device according to claim 1, further comprising a spacer layer formed on the first and second type of gate metal layers.

12. A vertical transistor device, comprising:
    a first plurality of channel regions in a first device region on a substrate;
    a second plurality of channel regions in a second device region on the substrate;
    a first type gate metal layer in the first device region and a second type gate metal layer in the second device region; and
    a barrier layer between the first and second device regions;
    wherein the barrier layer is disposed between the first type gate metal layer in the first device region and the second type gate metal layer in the second device region;
    wherein part of the first type gate metal layer and part the second type gate metal layer contact the barrier layer;
    wherein a bottom surface of the barrier layer is coplanar with a bottom surface of the first type gate metal layer and with a bottom surface of the second type gate metal layer; and
    wherein the first device region is an n-type transistor region and the second device region is a p-type transistor region.

13. The vertical transistor device according to claim 12, further comprising:
    a plurality of top source/drain regions on upper portions of each of the first and second plurality of channel regions in the first and second device regions; and
    a common top source/drain contact to the plurality of top source/drain regions disposed in the first and second device regions.

14. The vertical transistor device according to claim 12, further comprising a plurality of gate cap layers respectively on each of the first and second type of gate metal layers.

15. The vertical transistor device according to claim 12, further comprising:
    a plurality of bottom source/drain regions on the substrate and around lower portions of each of the first and second plurality of fins in the first and second device regions; and
    a common bottom source/drain contact to the plurality of bottom source/drain regions disposed in the first and second device regions.

16. The vertical transistor device according to claim 15, further comprising liner layers formed on lower portions of the plurality of bottom source/drain regions under the common bottom source/drain contact.

17. The vertical transistor device according to claim 15, further comprising:
    a first type bottom source/drain region on the substrate and around lower portions of the first plurality of channel regions in the first device region; and
    a second type bottom source/drain region on the substrate and around lower portions of the second plurality of channel regions in the second device region.

18. The vertical transistor device according to claim 17, further comprising:
    a common bottom source/drain contact to the first and second type bottom source/drain regions; and
    liner layers formed on lower portions of the first and second type bottom source/drain regions under the common bottom source/drain contact.

19. The vertical transistor device according to claim 12, further comprising a common gate contact to the first and second type of gate metal layers disposed in the first and second device regions.

20. The vertical transistor device according to claim 12, further comprising a spacer layer formed on the first and second type of gate metal layers.

* * * * *